United States Patent [19]

Bolton et al.

[11] 4,360,703
[45] Nov. 23, 1982

[54] PHOTOVOLTAIC CELL HAVING P-N JUNCTION OF ORGANIC MATERIALS

[75] Inventors: James R. Bolton; Te-Fu Ho; Alan R. McIntosh, all of London, Canada

[73] Assignee: National Research Council of Canada, Ottawa, Canada

[21] Appl. No.: 258,278

[22] Filed: Apr. 28, 1981

[51] Int. Cl.³ ............................................. H01L 31/06
[52] U.S. Cl. ..................................... 136/263; 357/8; 357/30
[58] Field of Search .................. 136/263; 357/8, 30 J, 357/30 B

[56] References Cited

U.S. PATENT DOCUMENTS

| | | | |
|---|---|---|---|
| 3,057,947 | 10/1962 | Calvin et al. | 136/263 |
| 3,507,706 | 4/1970 | Webb | 136/263 |
| 3,873,215 | 3/1975 | Quinlan | 356/218 |
| 4,197,142 | 4/1980 | Bolton et al. | 136/255 |

OTHER PUBLICATIONS

T. F. Ho et al., "Intramolecular Photochemical Electron Transfer . . .", *Nature,* Jul. 1980.
E. E. Polymeropoulis et al., "Monolayer Assemblies with Functional Units of Sensitizing and Conducting Molecular Components . . .", *Thin Solid Films,* vol. 68, pp. 173–190 (1980).

*Primary Examiner*—Aaron Weisstuch
*Attorney, Agent, or Firm*—Mitches & Co.

[57] ABSTRACT

A "molecular p-n junction" is formed by an organic compound which has a molecular portion susceptible of electron donation and another molecular portion susceptible of electron acceptance, each of these two portions being within the same compound or molecule and interconnected by a linkage portion. Thus the compound consists of three molecular parts which may in other environments exist as separate molecules. The electron donation molecule and electron acceptance molecule are separated by an intramolecular linkage or chain so that the three form one composite molecule. The donor and acceptor molecules, if the intermolecular linkage is adequate and generally in the preferred range of 15 Å to 25 Å, or generally between 10 Å to 40 Å, is susceptible, under the influence of light, of donating an electron to the acceptor. As such, the compound functions as a "molecular p-n junction".

18 Claims, 7 Drawing Figures

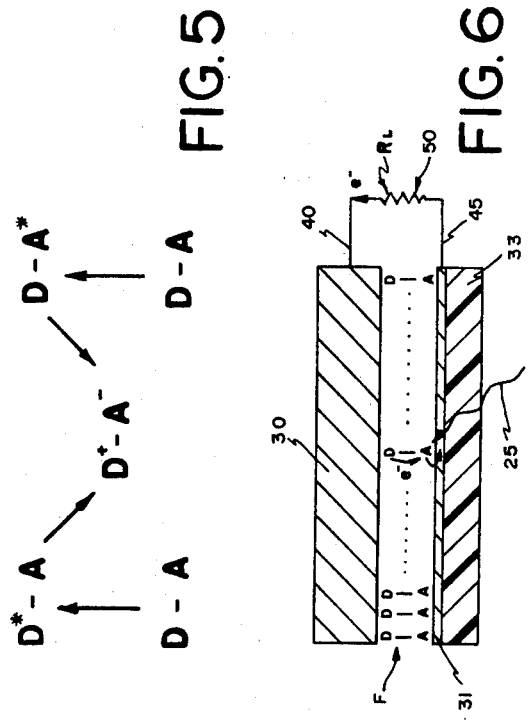

PHOTOVOLTAIC CELL HAVING P-N JUNCTION OF ORGANIC MATERIALS

This invention relates to a photovoltaic cell and in particular to such a cell wherein the active ingredient of the device is a "molecular p-n junction".

BACKGROUND OF THE INVENTION

Conventional p-n Junctions

In conventional silicon photovoltaic cells there is a junction interfaced by "p"-type and "n"-type silicon each respectively generated by diffusion. In one instance an electron poor substance (for example boron) and in the other instance an electron rich substance (for example phosphorus) are used as impurities and are diffused into opposite sides of a single wafer of crystalline silicon or preferably into a single crystal of silicon. A "molecular p-n junction" is thus created. The function of the p-n junction in such a photovoltaic cell is to separate electrons and holes that are respectively created by the absorption of light near the junction.

There are two problems which arise with such p-n junction silicon photovoltaic cells. Firstly, the junction cannot be made very sharp and it usually extends in thickness to over one hundred nanometers. The second difficulty is to assure that the absorption of light will occur only at or near the junction. With materials that are presently used this precision is very difficult to achieve.

Photosynthesis

In nature, the primary step of photosynthesis is a resultant of a reaction which can be contemplated to be similar to that of a solar cell. There is a charge separation of an electron from a hole and this particular separation takes place under the influence of light, solar energy, within the highly organized reaction-centre protein molecule. The potent molecule chlorophyll, which is the primary absorber of sunlight in photosynthesis in nature, is latched, or embedded within the complex of the reaction-centre protein as an ingredient molecular structure of living plants.

Thus, within what is commonly known as the thylakoid membrane of a plant leaf, light is absorbed by a chlorophyll entity (chl) and this emits or drives an electron across from the chlorophyll entity of the protein molecule to an electron acceptor, A (which can be plastoquinone), on the other side of the same protein molecule. Thus for this protein molecule, on one side is an electron donor, D, and on the other side, an electron acceptor, A.

THE INVENTION

We have discovered that one may synthesize an organic molecule so that it exhibits an electron donor portion, D, and an electron acceptor portion, A, and when the molecule is subjected to light, the molecule is polarized such that the donor portion becomes excited; or, perhaps alternatively the acceptor portion becomes excited depending upon the specific molecular structure selected. In any event an electron is freed from the donor molecule portion and thus the molecule may be appropriately used as a free electron source.

It is thus a feature of the invention to improve the efficiency of the p-n junction by creating an analog thereof; namely, a biological or "molecular p-n junction". In this aspect, a light sensitive compound comprises, an electron donor molecule portion, D, and an electron acceptor molecule portion, A, spaced apart and inter-connected by an organic linkage of a predetermined distance, d.

In a preferred embodiment this "molecular p-n junction" is formed by an organic compound which has a molecule portion susceptible of electron donation and another molecule portion susceptible of electron acceptance, each of these two molecules being within the same compound or molecule. This molecule consists of three molecular parts each of which can exist as separate molecules. Hereinafter we will refer to these molecular parts as the donor molecule, the acceptor molecule and the linking chain even though they are parts of one composite molecule. Thus the donor and acceptor molecules are appropriately spaced apart and inter-connected by a linking chain so that when the compound is irradiated with light, the electron donating or donor molecule, D, donates its electron to the electron accepting molecule or acceptor molecule, A, within the composite molecule.

In a preferred embodiment, these molecules are a porphyrin (P) and a quinone (Q) inter-linked by a molecular chain of an appropriate intra-molecular distance, d, and formed into a single compound. This compound, if subjected to the influence of light, is polarized to free an electron when in the photochemically excited state. In this compound, the porphyrin (P) and quinone (Q) are appropriately spaced so that when the light does not irradiate the compound, the electron does not necessarily "jump back" from the acceptor to the donor.

An acceptable molecule having a donor and an acceptor entity or region therein with an intramolecular linkage is the compound of the following structure;

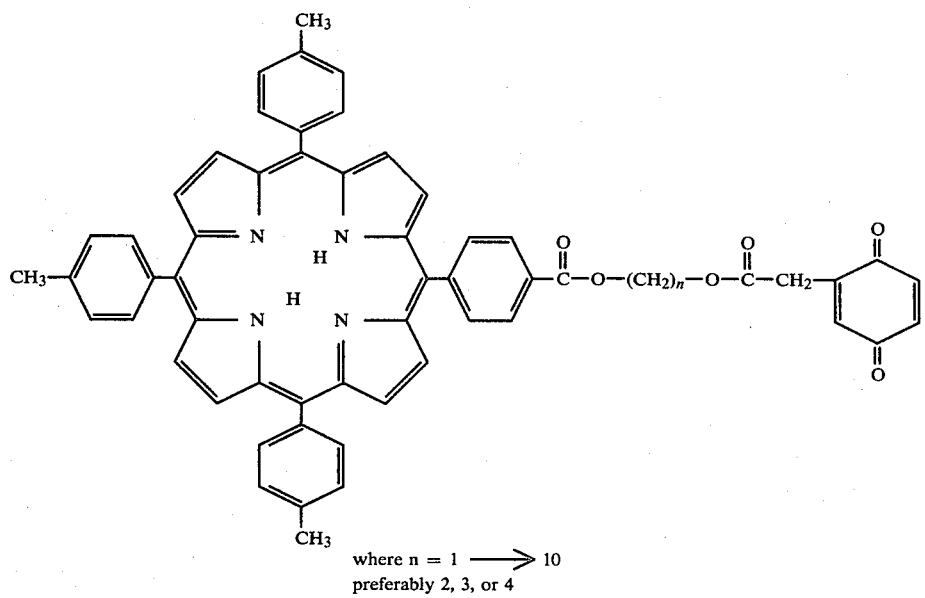

where n = 1 ⟶ 10
preferably 2, 3, or 4

In the molecule of the aforesaid compound, one of the electron acceptors, A, has been identified as a quinone, Q. The quinone is an analog to the natural electron acceptor, plastoquinone, in photosynthesis. The quinone has the following structure;

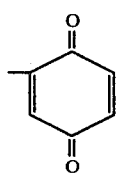

The donor of such compound is a porphyrin, an analog of chlorophyll and it has the following structure;

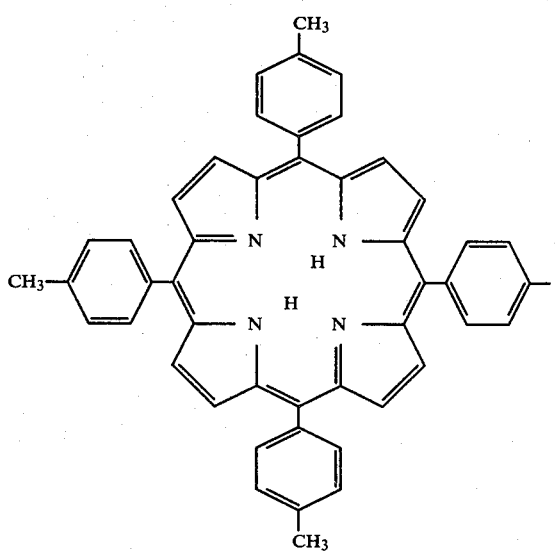

The quinone and the porphyrin are inter-linked by a molecular chain (intramolecular linkage) according to the following formula (or of a similar chain containing "amide" groups in place of the ester groups);

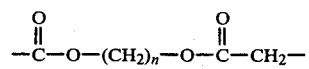

Where n = 1 ⟶ 10;

where n is an integer valued 1 through 10 and preferably valued at 2, 3 or 4.

The invention thus contemplates an organic molecule as an active ingredient of a photovoltaic cell, the cell comprising;

(a) a first and a second conductive material;

(b) a film of mono-molecular thickness, the film possessing molecules with porphyrin and quinone regions and hence donor and acceptor regions, the molecules oriented so that the donor regions are aligned and in a relative juxtaposition, with donor regions against one of the conductive materials, and the acceptor regions aligned and adhered to the second conductive material;

(c) one of the said conductive materials being transparent to light;

(d) electrodes attached to the conductive materials; and;

(e) means for connecting a load across the electrodes whereby, when the light penetrates into the molecules of the film, electrical energy flows through the load.

The invention also contemplates a new use, as a photoresistor, whose resistance varies in the presence of light, of the compound consisting;

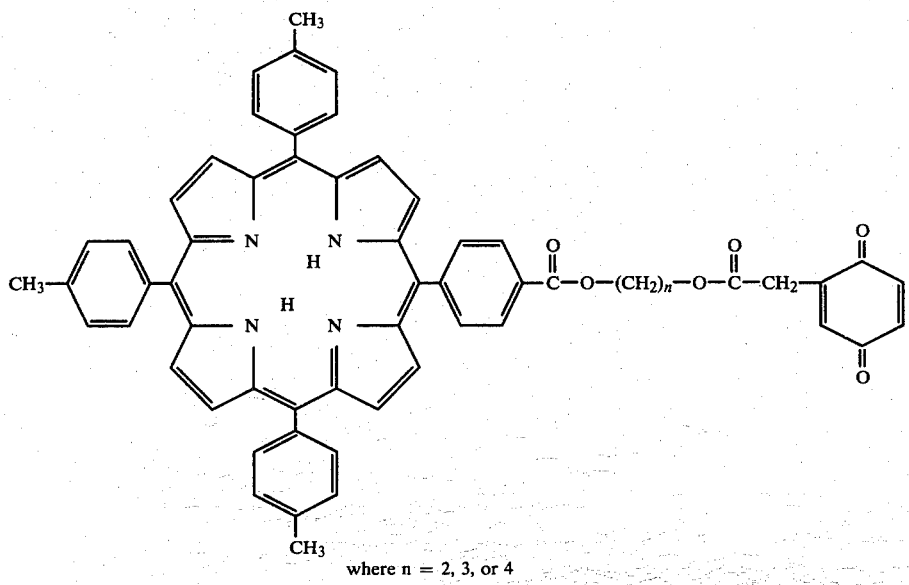

where n = 2, 3, or 4

The invention will now be described by way of example and with reference to the accompanying drawings in which;

FIG. 1 is a diagrammatic representation of a reaction-center protein in which is embedded a chlorophyll entity.

FIG. 2 is a schematic of a donor D, and acceptor A molecular regions of a molecule separated by a molecular linkage of distance d.

FIG. 3 is a diagrammatic view, for explanatory purposes, of the thylakoid membrane in a living plant leaf.

FIG. 4 is an equation showing the polarization of the donor and the acceptor regions under the influence of light.

FIG. 5 shows two flow paths involving the excitation of either the donor, D, or of the acceptor, A, regions in response to the influence of light to create a polarized donor-acceptor molecule.

FIG. 6 is an embodiment of photovoltaic cell wherein the mono-molecular layer includes acceptor active molecules.

FIG. 7 is a photovoltaic device wherein the monomolecular layer includes donor active molecules.

Referring to FIG. 3, a cross section of a thylakoid membrane 10 is shown. The thickness of membrane is approximately 60 Å. There is a reaction-centre protein 12 containing a chlorophyll entity chl which when excited by a ray of light 25 excites the chlorophyll entity chl by releasing an electron, $e^-$ as indicated, which migrates over to the electron acceptor region A. This entity 12 in which this reaction takes place is known as a reaction-centre protein. Such thylakoid membranes exist within the leaves of living plants. The protein reaction centres are organized in an oriented manner within the thylakoid familiar to skilled persons in the art. The electron acceptor A has been identified in the published literature, some of which is identified in Schedule "A" to this application, as a plastoquinone or modified quinone molecule. In general, the natural process of photosynthesis can be represented by that depicted in FIG. 2 where D is an electron donor region of a molecule, which is excited by light, and A is an electron acceptor region. The "solar cell" within photosynthesis produces a voltage of about 1 volt (1 V) and has a solar power conversion and efficiency approximating 18%, which is better than most commercial silicon solar cells presently available. The plant then uses this electronic power to drive the biochemical reactions of photosynthesis and ultimately to store a portion the electrical energy as stored chemical energy in the form of carbohydrates.

This phenomenon is known as the in vivo photochemical solar energy conversion and storage reactions of photosynthesis.

A compound, which may be synthesized, and which is capable of creating donor and acceptor regions has the following structure.

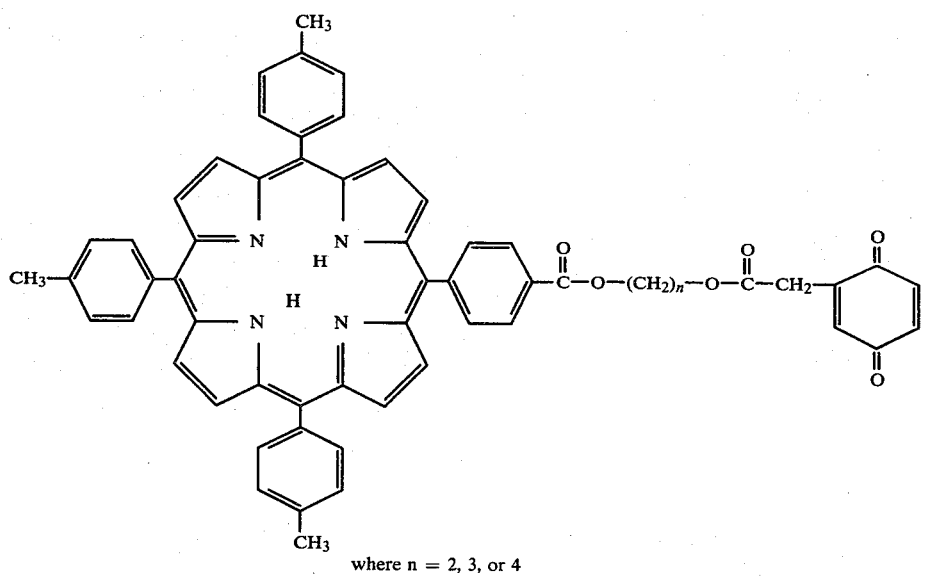

where n = 2, 3, or 4

In our paper entitled "Intramolecular Photochemical Electron Transfer in a Linked Porphyrin-Quinone Molecule as a Model for the Primary Step of Photosynthesis", Nature-July 11, 1980, page 286, we disclosed the foresaid compound. In FIGS. 2 and 3 of that paper, and particularly in FIG. 3, thereof evidence is given that such molecules are polarized under the influence of light so that the left hand portion of the molecule, which is the porphyrin, P, becomes the electron donor, D, while the quinone, Q, the right hand side of the molecule, becomes the electron acceptor, A. Depending upon the length of P-Q compound, which is dependent upon the value of n, stability or instability of the electron transfer is achieved when the compound is under the influence of light. In the compound there studied n=3.

We now conceive that utilizing, for example, the aforesaid compound within a mono-molecular film layer, and organizing that mono-molecular layer such that the molecules are juxtapositioned and oriented wherein the acceptor and donor regions (porphyrin and quinone regions) are oriented in relative juxaposition, such a mono-molecular film will, under the influence of light directed normal to the film surface, result in an electron charge separation according the equation of FIG. 4.

If alternative compounds are selected having properties consistent with the aforesaid compound, two possible reactions will occur. Referring to FIG. 5, either the reaction on the left hand side thereof or on the right hand side thereof are possible in creating a polarized $D^+$-$A^-$ compound. That is, depending on the D-A compound properties, either the donor portion is excited by the light to the D* state to emit an electron, or the acceptor portion of the molecule is excited by light to A* state to extract an electron from the donor portion.

In either flow path the common entity of a polarized $D^+$-$A^-$ molecule is achieved.

Thus we perceive a new type of photovoltaic cell utilizing as the active ingredient an organic molecule while generating an EMF under the influence of light and comprising this molecule in the form of a mono-molecular oriented layer or film.

Thus, referring again to FIG. 5, either the D, or A can absorb light. In the former case (which is a situation analogous to photosynthesis), D functions as a photochemical reducing agent, whereas in the latter case, A functions as a photochemical oxidizing agent.

As one of the inventors has earlier shown, J. R. Bolton, Science Vol. 202, page 705 (1978) the optimum wavelength for conversion of sunlight, at least at the earth's surface, to work—electricity—is approximately 840 nanometers. Thus D (or A) should absorb strongly in the visible and near infrared region of the spectrum if good operating efficiency is to be achieved.

The distance, d, between D and A is determined by the length of the linkage and for the aforesaid compound is dependent upon the value of n, where n is an integer. The value of n therefore will determine the distance, d, between D and A, a factor which will be important in establishing the efficiency of the electron charge separation under light.

If the distance, d, between D and A is too short, e.g. when n=0, the electron transfer may occur in light but there will be high probability of a back electron transfer before the electron can be picked off from the acceptor, A. In this case the acceptor cannot be coupled effectively to an external electric circuit to cause electrons to flow. Thus the efficiency in this case will be low.

On the other hand, if the distance, d, between D and A is too great, e.g. when n has a very high value, this will require an electron transfer over a large distance from the donor to the acceptor and hence there will be a low probability that such a transfer will occur in light and again efficiency will be lost. The optimum value of the distance, d, between the acceptor and the donor D, will be found in the vicinity or the preferred range of 15 Å to 25 Å, as when n=2, 3 or 4, although in certain applications n may have an acceptable range of values of 1 through 10, whereupon distances of 10 Å to 40 Å are possible. The distance, d, can also be affected by the conformation of the molecule, which preferably, in the mono-layer of the film, F, the D-A molecule would be in the stretched conformation.

Another important design criterion is the difference in the electro-chemical potential between the D and A regions.

Under all circumstances the reaction:

$$D-A = D^+ - A^-$$

must be uphill in energy (i.e. a positive Gibbs Energy Change or an overall negative change in the standard electrochemical potential $\Delta E°$). If $|\Delta E°|$ is too small the efficiency will be low; however, as $|\Delta E°|$ approaches about $(E_g-0.4)$V (here $E_g$ is the energy of the excited state), the thermodynamic limit is approached and efficiency again will drop. $E_g$ at 840 nanometers is approximately 1.5 eV; hence $|\Delta E°|$ should be approximately 0.8 to 1.0 V for optimal efficiency.

Now referring to FIGS. 6 and 7 and to the solar cells according to our invention utilizing a D-A molecule as the active ingredient, such D-A molecule is arranged into an oriented film generally shown as region F interposed between a transparent conductive material 31 (31') and a solid conductive material 30 (30').

In FIG. 6 the film, F, consists of D-A molecules in juxtaposition as an oriented mono-molecular layer film, F, preferably in the stretched conformation. The D-A molecules are oriented so that the donor ends D, are toward the solid conducting electrode 30. Thus the D-A molecules are oriented so that the donor, D, ends are towards the conducting electrode 30, while the acceptor, A, ends are toward the transparent conducting film 31. The film 31, is layered on a glass sheet or other transparent sheet 33. When light 25 penetrates the glass 33 and the transparent conductor film 31, it excites the acceptors A, as in the right-hand side of FIG. 5, and this extracts an electron from the molecularly attached donor, D. Electrons flow into the juxtapositioned conductor 45, and into the external circuit 50, and load $R_L$, to be returned to the electrode 40 and the conductor 30 to the donor regions, D.

Referring to FIG. 7, a solid conducting electrode, for instance a good conductor such as silver material 30', forms one of the conductors or conductive materials, and a second transparent conductor 31', for example one formed of another good conductor but of transparent material such as tin oxide, is layered on a transparent sheet of insulating material such as glass 33'. Alternatively the transparent conductor 31' could be a very thin coating of metal such as aluminum such that a high fraction of the incident light is transmitted through this layer. The acceptors are oriented to be juxtaposed against the solid (non-transparent) conductive material 30'.

Rays of light 25, penetrate through the glass 33' and the transparent conductive material 31' and the donor regions, D, of the film F, which are adjacent thereto causing an electron to be freed from the molecule, whereupon the electron is passed to the acceptor, A, and to the solid conductor 30' and hence to to the external circuit 50, and the external load, $R_L$.

In a variation of the embodiments of FIGS. 6 and 7 the conductive material 30(30') and 31(31') may either or both be semi-conductors.

It should now be appreciated that a D-A molecule therefore, and particularly the compound:

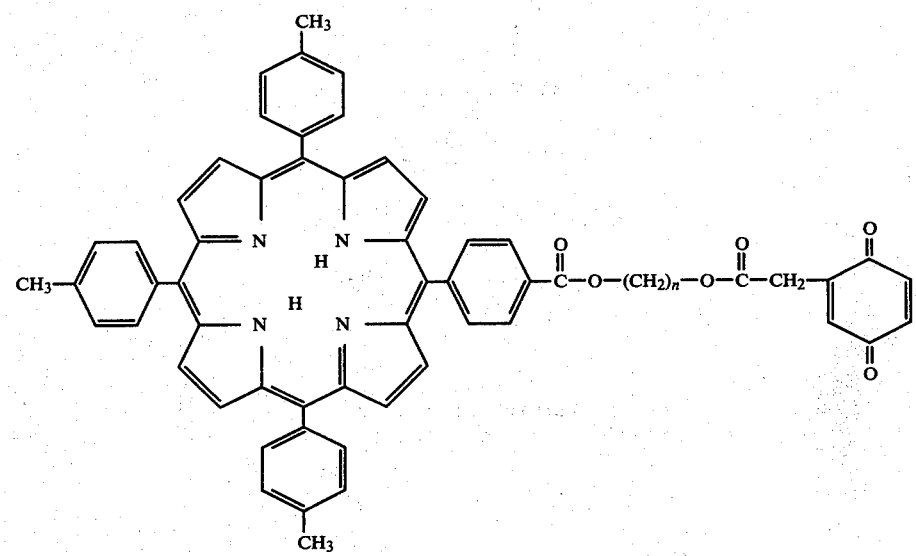

is an organic material possessing properties of a "molecular p-n junction."

SCHEDULE A (Relevant Publications)

1. Kong, J. L. Y. & Loach, P. A. in *Frontiers of Biological Energetics*—Electrons to Tissues, Vol. 1 (eds. Dutton, P. L., Leigh, J. S. & Scarpa, A.) 73–82 (Academic, New York, 1978). Abstract No. THPMA 12 of the 7th Annual Meeting of the American Society for Photobiology, Asilomar (1979); *J. Het. Chem.* (in the press).
2. Kong, J. L. Y. and Loach, P. A. in *Journal of Heterocyclic Chemistry*, June 1980, 737 "Synthesis of Covalently-Linked Porphyrin-Quinone Complexes".
3. Bolton, James R., *Science, Nov.* 17, 1978, Vol. 202, pp. 705–711 "Solid Fuels".
4. Bolton, James R., *Ann Rev. Energy.* 1979. 4:353–401 "Photochemical Conversion and Storage of Solar Energy".
5. Bolton, James R., Ho, Te-Fu, McIntosh Alan R., *Nature*, July 17, 1980. "Intramolecular Photochemical Electron Transfer In a Linked Porphyrin-Quinone Molecule as a Model for the Primary Step of Photosynthesis".

The embodiments of the invention in which an exclusive property or privilege is claimed are defined as follows:

1. A photovoltaic cell comprising;
(a) a first and a second conductive material;
(b) a film of mono-molecular thickness, the film possessing molecules each having donor and acceptor regions, the molecules oriented so that the donor regions of adjacent molecules are aligned and are in relative juxtaposition, with donor regions against one of the conductive materials, and the acceptor regions aligned and adhered to the second conductive material;
(c) one of the said conductive materials being transparent to light;
(d) electrodes attached to the conductive materials; and,
(e) means for connecting a load across the electrodes whereby, when the light penetrates into the molecules of the film, electrical energy flows through the load.

2. The cell as claimed in claim 1 wherein the donor region is a porphyrin, and the acceptor region is a quinone.

3. The cell as claimed in claim 2 where the molecule is composed of the following structural formulae;

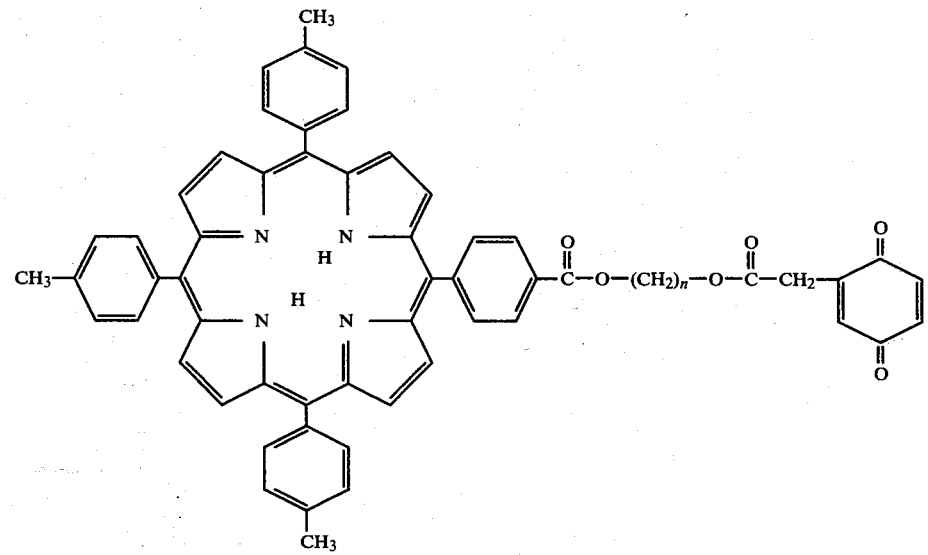

where n is an integer valued at 1 through 10.

4. The cell as claimed in claim 2 wherein the molecule is composed of the following structural formulae;

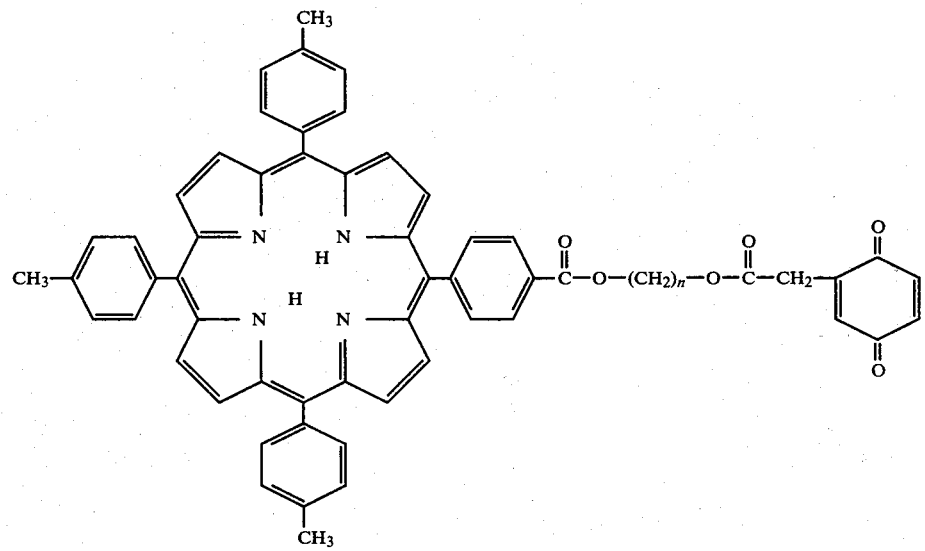

where n = 2, 3, or 4.

5. The cell as claimed in claim 1, 2 or 4 wherein the donor region of the molecule is oriented to be juxtaposed to the said conductive material that is transparent to light.

6. The cell as claimed in claim 1, 2 or 4 wherein the acceptor region of the molecule is in juxtaposition to that conductive material transparent to light.

7. The cell as claimed in claim 1, 2, or 3 wherein the distance between the donor and the acceptor regions is between 10 Å to 40 Å.

8. The cell as claimed in claim 1, 2, or 3 wherein the distance between the donor and the acceptor regions is between 15 Å to 25 Å.

9. A photovoltaic cell comprising;
   (a) a first and a second conductive material, at least one of which is a semi-conductor;
   (b) a film of mono-molecular thickness, the film possessing molecules each having donor and acceptor regions, the molecules oriented so that the donor regions of adjacent molecules are aligned and are in relative juxtaposition, with donor regions against one of the conductive materials, and acceptor regions aligned and adhered to the other conductive material;
   (c) at least one of the said conductive materials being transparent to light;
   (d) electrodes attached to the conductive materials; and,
   (e) means for connecting a load across the electrodes whereby, when the light penetrates into the molecules of the film, electrical energy flows through the load.

10. The cell as claimed in claim 9 wherein the semi-conductor is transparent to light.

11. The cell as claimed in claim 9 wherein both conductive materials are semi-conductors.

12. The cell as claimed in claim 9, 10 or 11 wherein the donor region is a porphyrin, and the acceptor region is a quinone.

13. The cell as claimed in claim 9 where the molecule is composed of the following structural formulae;

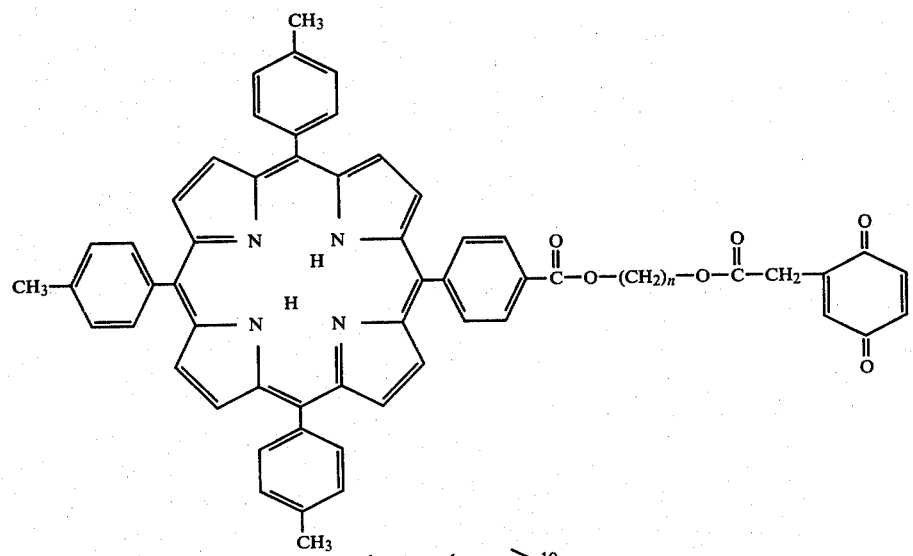

where n = 1 ⟶ 10.

14. The cell as claimed in claim 13 where n=2, 3, or 4.

15. The cell as claimed in claim 9, 10 or 11 wherein the donor region of the molecule is in juxtaposition with the conductive material that is non-transparent to light.

16. The cell as claimed in 9, 10, or 11 wherein the donor region of the molecule is in juxtaposition with the conductive material transparent to light.

17. The cell as claimed in claim 9, 10 or 11 wherein the acceptor region of the molecule is in juxtaposition to that semi-conductor material transparent to light.

18. The cell as claimed in claim 9, 10 or 11 wherein the acceptor region of the molecule is in juxtaposition to that semi-conductor material non-transparent to light.